(12) United States Patent
Lord et al.

(10) Patent No.: US 10,070,667 B2
(45) Date of Patent: Sep. 11, 2018

(54) ELECTRONIC SMOKING ARTICLE WITH BATTERY POWER CONTROL

(71) Applicant: NICOVENTURES HOLDINGS LIMITED, London (GB)

(72) Inventors: Christopher Lord, London (GB); Martin Mullin, London (GB); Konrad Szymkiewicz, London (GB)

(73) Assignee: Nicoventures Holdings Limited, London (GB)

( * ) Notice: Subject to any disclaimer, the term of this patent is extended or adjusted under 35 U.S.C. 154(b) by 94 days.

(21) Appl. No.: 14/912,598

(22) PCT Filed: Aug. 29, 2014

(86) PCT No.: PCT/GB2014/052625
§ 371 (c)(1),
(2) Date: Feb. 17, 2016

(87) PCT Pub. No.: WO2015/028814
PCT Pub. Date: Mar. 5, 2015

(65) Prior Publication Data
US 2016/0206000 A1      Jul. 21, 2016

(30) Foreign Application Priority Data

Aug. 30, 2013   (GB) .................................. 1315460.4

(51) Int. Cl.
*A24F 47/00*        (2006.01)
*H03K 17/95*       (2006.01)
(Continued)

(52) U.S. Cl.
CPC ............ *A24F 47/008* (2013.01); *B65D 85/10* (2013.01); *H02J 7/007* (2013.01);
(Continued)

(58) Field of Classification Search
CPC ............................... H02J 7/0044; A24F 47/008
(Continued)

(56) References Cited

U.S. PATENT DOCUMENTS

| 5,144,962 A | 9/1992 | Counts |
| 5,372,148 A | 12/1994 | McCafferty |

(Continued)

FOREIGN PATENT DOCUMENTS

| CA | 2641869 A1 | 5/2010 |
| CN | 1284493 C | 11/2006 |

(Continued)

OTHER PUBLICATIONS

PCT International Search Report and Written Opinion of the International Searching Authority for PCT/GB2014/052625, dated Feb. 6, 2015, 17 pages.

(Continued)

*Primary Examiner* — Vanessa Girardi
(74) *Attorney, Agent, or Firm* — Patterson Thuente Pedersen, P.A.

(57) ABSTRACT

Apparatus comprising an electronic device (1, 2, 3) such as an electronic smoking device to be powered by a battery (14) in first and second different modes that consume different levels of electrical power; and a part (24) that produces a magnetic field such a permanent magnet, that is separable from the device in preparation for its operation. The electronic device is configured to detect changes in the magnetic field at the device and in response thereto, to change its mode. The magnet may be included in packaging (32) for the device so that whilst in the packaging, the device is switched to a low power storage mode and automatically switches to an operational mode when removed from the packaging ready for use.

21 Claims, 5 Drawing Sheets

(51) Int. Cl.
  *H03K 17/97* (2006.01)
  *H02J 7/00* (2006.01)
  *H05B 1/02* (2006.01)
  *B65D 85/10* (2006.01)
(52) U.S. Cl.
  CPC ......... *H03K 17/9517* (2013.01); *H03K 17/97* (2013.01); *H05B 1/0202* (2013.01)
(58) Field of Classification Search
  USPC ........ 131/329, 328, 347, 369; 320/108, 114, 320/115
  See application file for complete search history.

(56) References Cited

U.S. PATENT DOCUMENTS

| | | | |
|---|---|---|---|
| 5,894,841 | A | 4/1999 | Voges |
| 7,852,041 | B2* | 12/2010 | Lam ....................... H02K 53/00 320/101 |
| 8,674,656 | B2* | 3/2014 | Iio ......................... A61M 5/003 320/106 |
| 9,032,968 | B2* | 5/2015 | Glasberg ............... A24F 47/008 131/273 |
| 2004/0149297 | A1 | 8/2004 | Sharpe |
| 2005/0045193 | A1 | 3/2005 | Yang |
| 2005/0166076 | A1 | 7/2005 | Truong |
| 2005/0268911 | A1 | 12/2005 | Cross |
| 2007/0267031 | A1 | 11/2007 | Hon |
| 2009/0058578 | A1 | 3/2009 | Huang |
| 2009/0072783 | A1* | 3/2009 | Gaspar ................. A01M 1/2033 320/108 |
| 2009/0095311 | A1 | 4/2009 | Han |
| 2009/0115745 | A1 | 5/2009 | Chuang |
| 2010/0052660 | A1 | 3/2010 | Wang |
| 2010/0109889 | A1 | 5/2010 | Deng |
| 2010/0242974 | A1 | 9/2010 | Guocheng |
| 2011/0226266 | A1 | 9/2011 | Tao |
| 2011/0265806 | A1 | 11/2011 | Alarcon |
| 2012/0170177 | A1 | 7/2012 | Pertuit |
| 2012/0227753 | A1 | 9/2012 | Newton |
| 2012/0318882 | A1 | 12/2012 | Abehasera |
| 2013/0037041 | A1 | 2/2013 | Worm et al. |
| 2013/0042865 | A1 | 2/2013 | Monsess et al. |
| 2013/0169230 | A1 | 7/2013 | Li et al. |
| 2013/0192615 | A1 | 8/2013 | Tucker |
| 2014/0053858 | A1* | 2/2014 | Liu .......................... A24F 15/18 131/329 |
| 2015/0128966 | A1 | 5/2015 | Lord |
| 2015/0128972 | A1* | 5/2015 | Verleur ................. A24F 47/008 131/329 |
| 2015/0136153 | A1 | 5/2015 | Lord |
| 2015/0257448 | A1 | 9/2015 | Lord |
| 2016/0049804 | A1* | 2/2016 | Lee ....................... H02J 7/0057 320/107 |
| 2016/0226286 | A1* | 8/2016 | Xiang ................... A24F 47/002 |
| 2017/0035114 | A1 | 2/2017 | Lord |

FOREIGN PATENT DOCUMENTS

| | | |
|---|---|---|
| CN | 101969800 A | 2/2011 |
| CN | 101977522 A | 2/2011 |
| CN | 201821914 | 5/2011 |
| CN | 201821914 U | 5/2011 |
| CN | 102264251 A | 11/2011 |
| CN | 102298435 A | 12/2011 |
| CN | 202474905 U | 10/2012 |
| CN | 102970885 A | 3/2013 |
| CN | 203504217 U | 3/2014 |
| DE | 202005018998 U1 | 2/2006 |
| EP | 2110034 A1 | 10/2009 |
| EP | 2201850 A1 | 6/2010 |
| GB | 2468932 A | 9/2010 |
| JP | 05-307439 | 11/1993 |
| JP | 10-320082 A | 5/1997 |
| JP | 2011-087569 A | 5/2009 |
| RU | 2360583 C1 | 11/2009 |
| WO | WO 2000050111 | 8/2000 |
| WO | WO 2007074430 A1 | 7/2007 |
| WO | WO 2009032064 A2 | 3/2009 |
| WO | WO2004041007 | 8/2009 |
| WO | WO2010040015 | 4/2010 |
| WO | WO 2010/118644 A1 | 10/2010 |
| WO | WO 2012065754 A2 | 11/2010 |
| WO | WO 2011137453 A2 | 11/2011 |
| WO | WO 2011/147699 A1 | 12/2011 |
| WO | WO 2013025921 A1 | 2/2013 |
| WO | WO 2013060784 A2 | 5/2013 |
| WO | WO 2013126770 A1 | 8/2013 |

OTHER PUBLICATIONS

PCT International Preliminary Report on Patentability for PCT/GB2014/052625, dated Dec. 3, 2015, 22 pages.
Chinese Office Action, Application No. 201380025459.0, dated Feb. 14, 2016, 7 pages (19 pages with translation).
Russian Search Report, Application No. 2014 150 420, dated Aug. 8, 2016, 3 pages.
Japanese Office Action, Application No. 2016537385, dated Mar. 14, 2017, 6 pages.
Japanese Decision to Grant, Application No. 2016537385, dated Sep. 27, 2017.
Korean Office Action, Application No. 20147035025, 5 pages, dated May 26, 2017.
Russian Office Action, Application No. 2014150419/12(080853), dated Jun. 24, 2016, 10 pages.
Great Britain Search Report, Application No. GB1208349.9, dated Sep. 14, 2012, 1 page.
Japanese Search Report, Application No. 2016-537385, dated Feb. 22, 2017, 43 pages (56 pages with translation).
Chinese Search Report/Office Action, Application No. 201480047679.8, dated Jul. 14, 2017, 5 pages.
Chinese Office Action, Application No. 201380025459.0, dated Oct. 27, 2016, 12 pages.

* cited by examiner

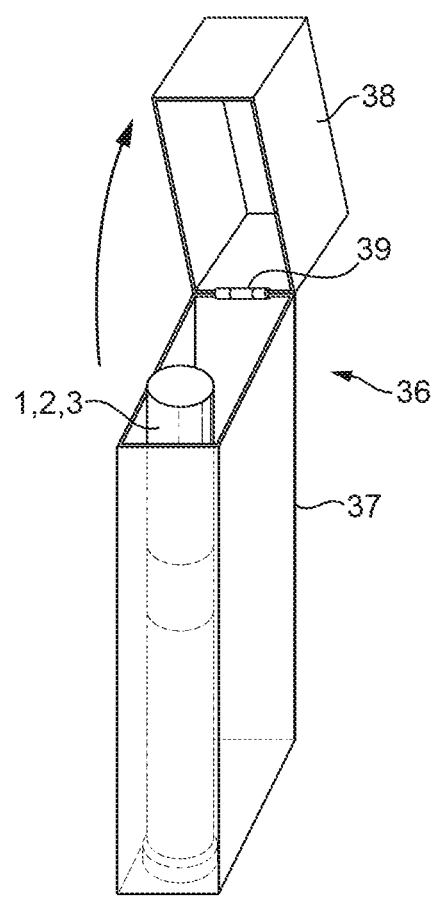
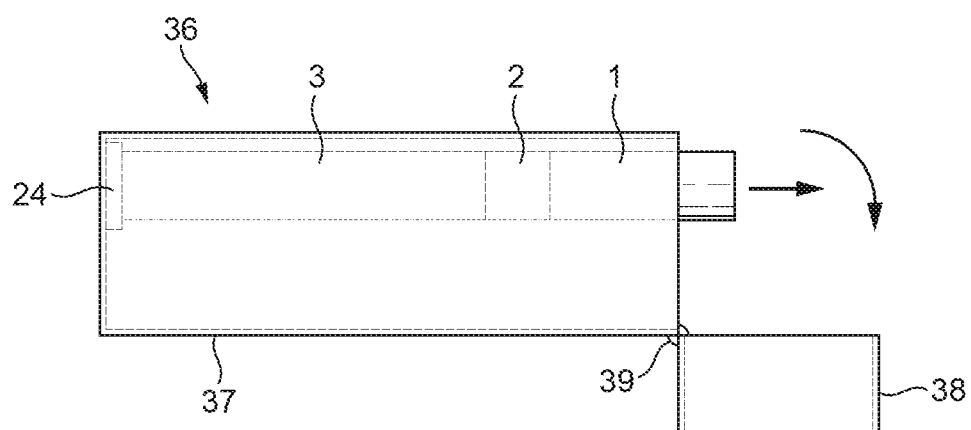

ELECTRONIC SMOKING ARTICLE WITH BATTERY POWER CONTROL

RELATED APPLICATIONS

The present application is a National Phase entry of PCT Application No. PCT/GB2014/052625, filed Aug. 29, 2014, which claims priority from GB Patent Application No. 1315460.4, filed Aug. 30, 2013, said applications being hereby incorporated by reference herein in their entireties.

FIELD

This specification discloses an apparatus in which the electrical power consumption of an electronic device such as an electronic cigarette can be changed between different modes, for example a low power storage mode and a higher power operational mode.

BACKGROUND

Battery powered electronic devices are often supplied with a battery in place ready for use and it is prudent to ensure that effective use of the battery power is made to drive the device in a suitable power consumption mode.

SUMMARY

An embodiment of an apparatus described herein comprises an electronic device to be powered by a battery in first and second different modes that consume different levels of electrical power; and a part that is separable from the device in preparation for its operation, the separable part producing a magnetic field, and the electronic device is configured to detect changes in the magnetic field at the device and in response, to change its mode.

The first mode may be a storage mode in which the device consumes a relatively low level of battery power, and the second mode may be an operational mode that consumes a higher battery power level than the first mode.

The electronic device may be configured to detect a reduced strength of magnetic field from the separable part upon separation thereof from the electronic device so as to switch from the storage mode to the operational mode.

An embodiment of the electrical device includes a control circuit and a magnetically responsive switch arrangement operative to control supply of electrical current to the control circuit in response to changes in the magnetic field. The magnetically responsive switch arrangement may include a Hall Effect device to provide an electrical control signal as a function of the magnetic field, and a switch responsive to the control signal to switch the supply of electrical current from the battery to the control circuit.

The electronic device may comprise a fluid flow generator and include an actuator to be powered by the battery under the control of the control circuit to entrain a composition from a supply thereof in a fluid flow for delivery to a user. The actuator may comprise an electrical heater which may be configured to vaporize liquid from a supply and to entrain the vaporized liquid in an airflow delivered to the user. In one embodiment the electrical device comprises an electronic smoking article such as an electronic cigarette.

The separable part may comprise packaging that includes a receptacle for the device, and a permanent magnet that provides the magnetic field, the apparatus being so configured that the device switches from the first mode to the second mode on removal from the packaging. The apparatus may be so configured that the device switches from the second mode to the first mode on insertion into the receptacle in the packaging.

The magnet can be mounted within the packaging so as not to be normally accessible to the user.

The packaging may comprise a sheet of plastics material including a recess of a shape complementary to that of the device, for example with the magnet received in the plastics material adjacent the recess.

Also, the packaging may comprise a carrying case with a flip-top lid.

In one embodiment, the electronic device has a generally cylindrical body and the packaging includes a sleeve removably fitted to one end of the body, the sleeve including a permanent magnet.

In one embodiment, a fluid flow generator is provided, to be supplied to a user in packaging containing a magnet, the fluid flow generator comprising: a body with a mouthpiece to supply a fluid flow to a user; an actuator to entrain a composition in the fluid flow; a control circuit to control operation of the actuator; and a magnetically responsive switch arrangement configured to control supply of electrical current to the control circuit to disable the supply of current whilst the generator is in the packaging and to enable the generator for operation in response to being removed from the packaging.

The fluid flow generator may comprise an electronic cigarette.

BRIEF DESCRIPTION OF THE DRAWINGS

FIG. 7 is a perspective view of another embodiment of the apparatus in which an electronic cigarette is received in a flip-top pack.

FIG. 8 is a side view of the apparatus of FIG. 7, with the lid of the flip-top pack open.

DETAILED DESCRIPTION

Figure 1:
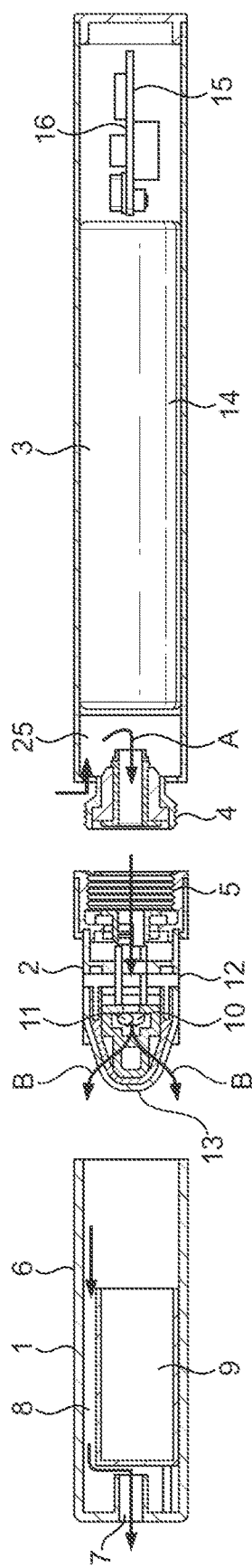
FIG. 1 is an exploded longitudinal sectional view of an electronic cigarette.
Figure 2:
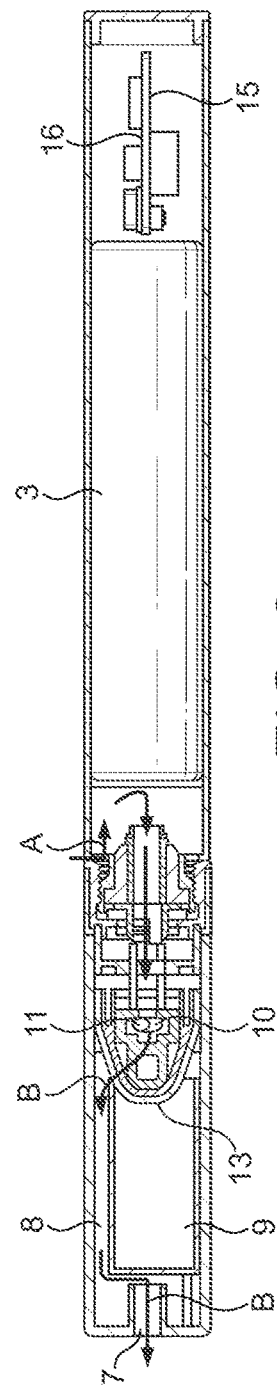
FIG. 2 is a sectional view of the electronic cigarette of FIG. 1 when assembled.

FIGS. 1 and 2 illustrate an electronic smoking device in the form of an electronic cigarette that comprises a mouthpiece 1, vaporizer device 2 and control unit 3 which can be assembled as shown in FIG. 2 to provide a generally cylindrical device that can be used as a substitute for a conventional tobacco burning cigarette. The control unit 3 is provided with a threaded extension 4 that is received in an interior thread 5 in the vapor device 2. The mouthpiece 1 comprises a generally cylindrical plastics casing 6 that can be push-fitted on to the vapor device 2.

The mouthpiece 1 has an outlet 7 to supply vapor to the mouth of the user and an outlet passageway 8 for the vapor which, in use is produced by the vapor device 2. The mouthpiece 1 also includes a liquid reservoir comprising a porous storage matrix 9 such as plastics open foam material impregnated with a vaporizable liquid, such as a nicotine containing liquid that in use is vaporized by the vapor device 2. The matrix 9 acts as a reservoir for the liquid and since the mouthpiece 1 is readily removable and replaceable, it can be used as a refill capsule when the liquid in the porous matrix 9 becomes depleted and needs to be replenished.

The vapor device 2 includes an electronic heating coil 10 that is wound around a ceramic core 11, supported on a ceramic base 12. A generally U-shaped wicking member 13 is configured to wick liquid from the reservoir 9 towards the heating element 10 by capillary action. The wicking member 13 may for example by made of a metallic foam such as nickel foam.

The heater coil 10 is powered by a rechargeable battery (or cell) 14 located in the control unit 3 through electrical contacts 18, 19 (not shown in FIGS. 1 and 2) which electrically couple the heater coil 10 to the battery 14 when the control unit 3 is fitted to the vapor device 2 by the engagement of threads 4, 5. The electrical power of the battery 14 is supplied to the heater coil under the control of a control circuit 15 mounted on circuit board 16 within the control unit 3. It will be appreciated that since an electronic cigarette is usually fairly small, frequently comparable in size to a conventional cigarette, the physical space available for the battery 14 is rather limited. This restriction on physical space in turn implies a restriction on the overall charge storage capacity of the battery 14.

Figure 6:
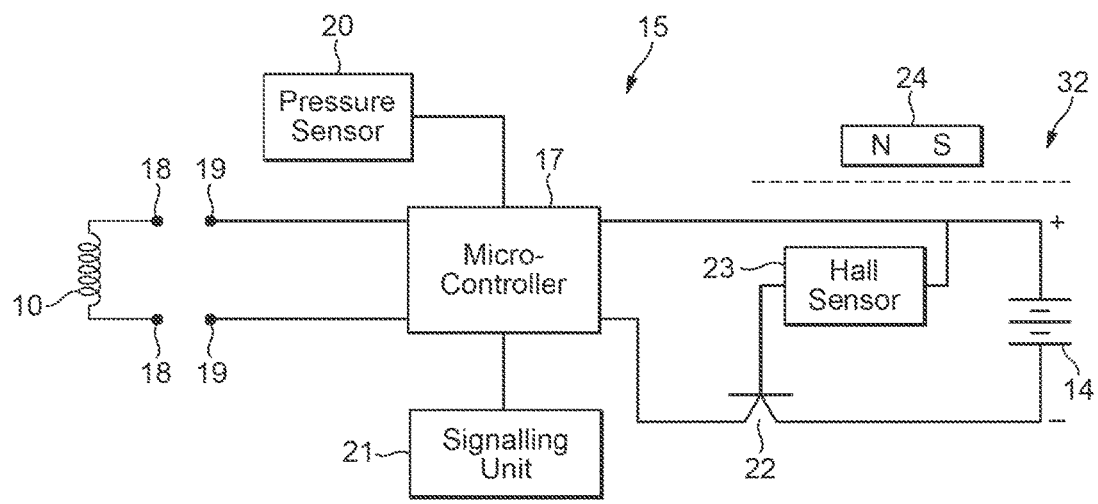
FIG. 6 is a schematic circuit diagram of the electronic cigarette.

As shown in FIG. 6, the control circuit 15 includes a microcontroller 17 powered by battery 14 to supply an electric heating current to the coil 10 through the contacts 18, 19 that are brought into electrical connection when the control unit 3 is engaged with the vapor device 2 by means of threads 4, 5 shown in FIG. 1.

A pressure sensor 20 detects when a user draws on the mouthpiece 8, as described in more detail hereinafter. The electronic cigarette described so far may correspond to the Intellicig™ device manufactured by CN Creative Ltd whose registered office is at The Old Tannery, Eastgate, Accrington, Lancashire, England, BB5 6PW.

Also, a signalling unit 21 is provided to provide audio or visual outputs to the user indicative of operational conditions of the device. For example, the signalling unit 21 may include a light emitting diode that glows red when the user draws on the device. The signalling unit 21 may provide predetermined audio or visual signals to indicate for example that the battery 14 needs to be recharged.

The supply of current from the battery 14 to the microcontroller 17 is controlled by switching transistor 22 that is responsive to a magnetic sensor, in the form of a Hall effect sensor 23, which is responsive to the magnetic field produced by a magnet, in the form of a permanent magnetic element 24 described in more detail hereinafter. When the Hall effect sensor 23 detects the magnetic field from the magnet 24, transistor 22 is switched off in a first, power saving mode but when the magnetic field is no longer detected, the transistor 22 is switched on to provide a second, operational mode.

When the user draws on the mouthpiece 1 so as to draw vapor through the outlet 7, the pressure sensor 20 detects the drop in pressure which is communicated from within the vapor device 2 through the interior of the control unit 3 to the circuit board 15. Microcontroller 17 responds to the pressure drop detected by the sensor 20 to supply electrical current to the heater coil 1*o*, which vaporizes liquid supplied by capillary action through the U-shaped wicking member 13. An air inlet passageway 25 is provided in the joint between the vapor unit 2 and control unit 3 so that air can be drawn through the threaded extension 4 of the control unit 3 into the vapor device 2 in the direction of arrows A, so that the resulting vapor is drawn in the direction of arrows B through passageway 8 to the outlet 7.

Figure 3:
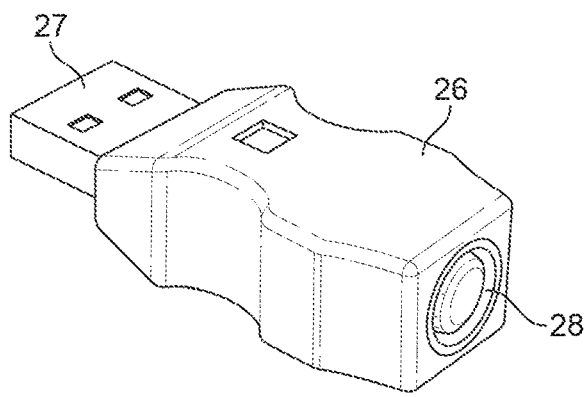
FIG. 3 is a charger device for the electronic cigarette.

FIG. 3 illustrates a device charger 26 for the rechargeable battery 14. The device 26 includes a power supply plug to receive electrical power, in this example a USB plug 27 for insertion into a USB socket on a PC or other similar device, together with a threaded inlet 28 to receive the threaded extension 4 of control unit 3 and make electrical contact with the contacts 19 shown in FIG. 6. It will however be appreciated that other device chargers could be used, for example to be powered by an external AC mains supply or other electrical power source.

Figure 4:
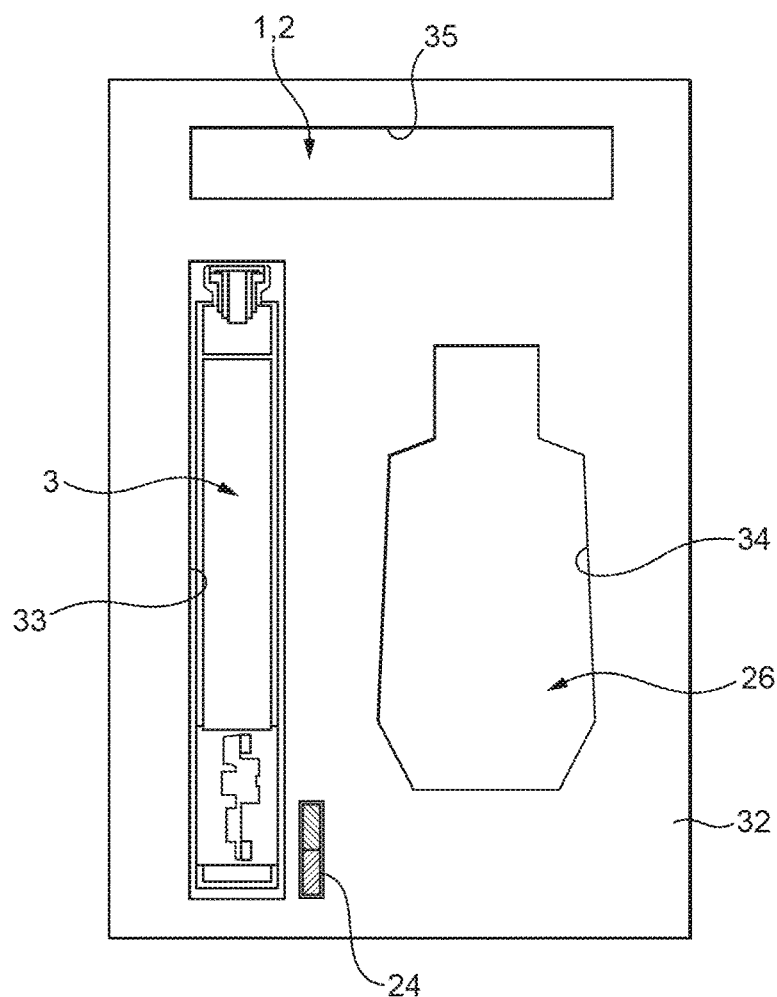
FIG. 4 illustrates packaging for the electronic cigarette in plan view.
Figure 5:
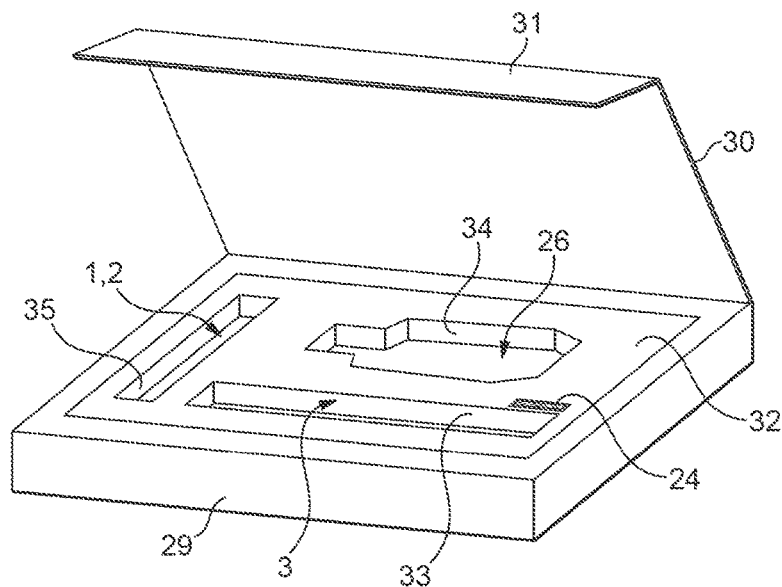
FIG. 5 is a perspective view of the packaging illustrated in FIG. 4.

An example of packaging for the electronic cigarette is illustrated in FIGS. 4 and 5. The packaging comprises a box 29 with an integral hinged lid 30 having a closure flap 31, made from suitable packaging sheet material such as card or plastics sheet material. A support member 32 conveniently made of plastics foam material includes recesses to receive the component parts of the electronic cigarettes 1, 2, 3 and the device charger 26. A receptacle 33 in the support member 32 receives the control unit 3, receptacle 34 receives the device charger 26 and receptacle 35 receives the vapor unit 2 along with a mouthpiece 1, which may comprise a dummy mouthpiece of the same exterior dimensions of mouthpiece 1 shown in FIGS. 1 and 2 but without a liquid reservoir 9. A supply of mouthpieces 1 may be provided in a separate pack so that in an initial step, the dummy mouthpiece 1 is removed and replaced by a mouthpiece 1 as shown in FIGS. 1 and 2, with a reservoir 9 of vaporizable liquid.

The support member 32 also includes the permanent magnet 24 illustrated in FIG. 6. The magnet 24 may be buried within the foam material 32 so as to be concealed from and not readily accessible by the user.

During manufacture, the mouthpiece 1, vaporizer 2, control unit 3 and device charger 26 are placed in their respective recesses 33-35 within the box 29 and the lid 30 sealed shut for shipment or storage. The battery 14 is charged as part of this manufacture, so that the device can be immediately ready for use when opened by a consumer, i.e. without the need for first charging the device, Box 29 is then purchased by a customer through any suitable sales distribution channel, which may involve warehousing and a significant delay between the initial manufacture and the subsequent removal of the device from the packaging by the customer ready for use.

In order to conserve the charge of the battery 14 during this period, the device is switched to a storage mode for low power consumption as a result of the Hall effect sensor 23 shown in FIG. 6 detecting the magnetic field produced by the bar magnet in the box 29. The Hall effect sensor 23, in the presence of magnet 24, switches off transistor 22 so as to minimize power drain from the battery 14. It has been found that in one device having a battery 14 in the form of a lithium cell of approx 130 mAh capacity, the use of the Hall effect sensor 23 and control switch 22 can decrease the power drain during the storage mode by a factor of approximately 4, thereby increasing the potential lifetime of a battery charge during storage mode accordingly—e.g. from 10800 hours to approximately 43200 hours.

In another embodiment, the Hall effect sensor 23 draws a current of 3 μAmp, and battery 14 has a capacity of over 100 mAh. In this case, the device can remain powered in shelf mode for up to four years or more.

It will be appreciated these figures are only by way of example, and other implementations will have different reductions in power drain according to their particular circumstances, and/or different battery capacities and lifetimes. In any event, it is clear that the utilization of the Hall effect sensor 23 does lead to a significant decrease in power drain, and therefore a corresponding significant increase in charge lifetime during storage mode.

When the user purchases the device and opens the box 29, they remove the various component parts of the electronic cigarette from the box, and assemble the electronic cigarette ready for use by screwing the threads 4, 5 together so as to connect the vapor device 2 and control unit 3. The removal of the control unit 3 from its recess 33 in box 29 results in a reduction of the magnetic field produced by magnet 24 in the vicinity of the Hall effect sensor 23, to a magnetic field strength that is no longer capable of operating the Hall effect sensor 23, so that transistor 22 is turned on to allow normal supply of electrical current from battery 14 to the microcontroller 17, ready for use. Thus, the device is switched from the first lower power consumption, storage mode to a second, operational mode during which the microcontroller 17 can control the supply of electrical power from the battery 14 to the heater coil 10 under the control of pressure sensor 20 when the user draws on the mouthpiece 1.

The use of the magnet 24 in the packaging and the Hall effect switch arrangement 22, 23 has the advantage that the switching to the operational mode is automatic and requires no intervention by the user when the electronic cigarette is first assembled for use after removal from the packaging.

It will be understood that if the device is subsequently disassembled and the control unit 3 is returned to the recess 33 in box 29, then the device will switch back into the lower power consumption storage mode. However, in other implementations, the circuitry of the device may be designed so that the storage mode is not re-entered, even if the device is returned to its packaging. One way of achieving this (by way of example only) is to have a further transistor in parallel with transistor 22. The gate of this additional transistor would be connected to a control output from the microcontroller 17. The additional transistor would be in an off state during storage mode following manufacture, but switched on by the control input from the microcontroller 17 upon entry into operational mode. In this case, the device would remain in operational mode even if a magnet were brought close to the Hall sensor 23, since although the magnet would then cause the Hall sensor 23 to switch off transistor 22, the additional transistor in parallel to transistor 22 would remain on to provide a power supply path to the operational components of the device.

Another example of packaging is illustrated in FIG. 7 in which the electronic cigarette 1, 2, 3 is received in a rectangular flip-top pack 36 that comprises a main body 37 with a hinged top 38 that may include a spring-loaded hinge 39 that biases the lid 28 to either a fully closed position or an open position as shown in FIG. 8. The magnet 24 is mounted at the bottom of the rectangular receptacle 37. It will be understood that magnet 24 interacts with the Hall sensor 23 in the same way as described with reference to FIGS. 4 and 5, so that when the electronic cigarette is removed from the pack, it is switched from the first, low power storage mode to a second operational mode, and such that it is switched back into the low power consumption mode when returned to the pack in close proximity to the magnet 24.

It will be understood that the packaging shown in FIGS. 7 and 8 may receive more than one electronic cigarette which may be each provided with a respective magnet 24 or a larger magnet to provide a suitable switching action for all electronic cigarettes received in the pack.

Figure 9:
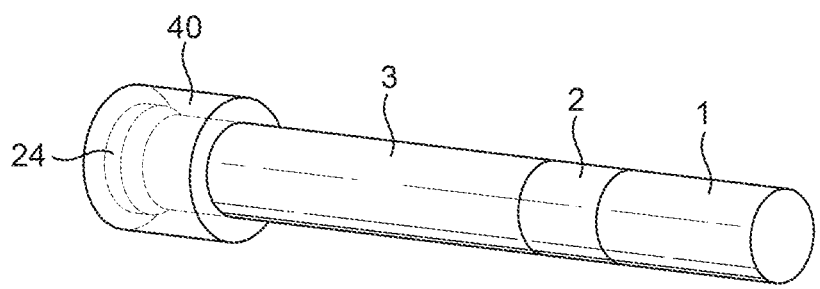
FIG. 9 is a perspective view of another embodiment of the apparatus in which an electronic cigarette is received within a sleeve containing a permanent magnet.
Figure 10:
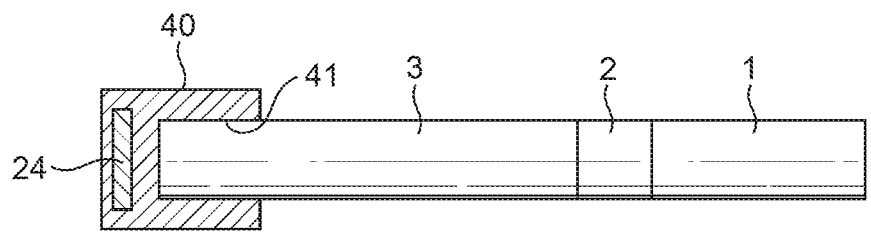
FIG. 10 is a schematic sectional view of the apparatus shown in FIG. 9.

FIGS. 9 and 10 illustrate an alternative arrangement for use with individual electronic cigarettes, in which a sleeve 40 conveniently made of molded plastics material includes a cylindrical recess 41 to be fitted onto the control unit 3 as shown, with the magnet 24 buried within the sleeve 40. When fitted to the control unit 3, the magnet 24 in the sleeve 40 switches the control unit to the first, low power consumption storage mode. When the electronic cigarette is removed from the sleeve 40, the Hall sensor 23 no longer detects the magnetic field and so the transistor switch 22 shown in FIG. 6 then permits electric current from the battery 14 to be supplied to the microcontroller 17.

Many modifications to the described embodiments of the apparatus are possible. For example, while the electronic cigarette has been described as a three component device, it will be appreciated that the magnetic switching can be achieved also for a two part or one part or multipart (with more than three parts) electronic cigarette. In addition, although a Hall effect device is well-suited to limiting power consumption during storage mode, some other magnetic switching device, such as a magnetic reed switch might be used instead.

Also, it will be understood that the microcontroller 17 may provide its own power saving routines in addition to the first and second modes described herein. For example the microcontroller 17 may switch into a power saving mode in the event that the pressure sensor 20 indicates that the user has not drawn on the mouthpiece 1 for a certain period of time, and may disable operation of the heater when the user has drawn on the mouthpiece 1 a predetermined maximum number of times within a predetermined period, to limit use of the cigarette. Such a device may therefore have three modes which in order of power drain (from lowest to highest) are: (i) a storage mode, this being the state after manufacture and packaging has been completed; (ii) a power-saving mode, which the device enters, for example, after a certain period of non-use; (iii) a powered mode, in which the device is ready for immediate operation. In this situational, the power-saving mode and the powered mode may be regarded as two forms of an operational mode.

The switching between the first and second modes may be utilized for an electronic smoking article other than an electronic cigarette, for example a heat-not-burn (HNB) device or an electrically powered spray device in which a pressurized liquid is stored in a canister and released under the control of an electronic valve in response to a pressure drop produced by the user drawing on the device. These devices are referred to herein collectively as "electronic smoking devices", which term is intended to cover any electronic device which can be used as a substitute for a cigarette or as a cessation device, which does not involve the conventional combustion of tobacco. The electronic cigarette can be considered as an embodiment of a fluid flow generator which may produce a fluid flow either by the use of an internal generator such as a pressurized fluid source or other internal driven mechanism, or with the assistance of an external driver such as a user drawing on a mouthpiece to provide the fluid flow.

In some cases the magnet 24 may be fixed to some item other than the packaging, for example, another component in the packaging. A further possibility is that the magnet 24 is part of the electronic cigarette itself. For example, the electronic cigarette may be packaged and shipped as two (or more) separated parts, a first part of which has a Hall sensor 23 and a second part of which includes a magnet 24. The device remains in storage mode while the components are kept separate. However, when they are joined or assembled in preparation for use, the Hall sensor 23 on the first part may detect the magnet 24 on the second part, and this can then cause the device to switch to an operational mode.

In order to address various issues and advance the art, the entirety of this disclosure shows by way of illustration various embodiments in which the claimed invention(s) may be practiced and provide for superior apparatus comprising a fluid flow generator to be supplied to a user in packaging containing a magnet and superior apparatus comprising an electronic device to be powered by a battery in first and second different modes that consume different levels of electrical power. The advantages and features of the disclosure are of a representative sample of embodiments only, and are not exhaustive and/or exclusive. They are presented only to assist in understanding and to teach the claimed features. It is to be understood that advantages, embodiments, examples, functions, features, structures, and/or other aspects of the disclosure are not to be considered limitations on the disclosure as defined by the claims or limitations on equivalents to the claims, and that other embodiments may be utilized and modifications may be made without departing from the scope and/or spirit of the disclosure. Various embodiments may suitably comprise, consist of, or consist essentially of, various combinations of the disclosed elements, components, features, parts, steps, means, etc. In addition, the disclosure includes other inventions not presently claimed, but which may be claimed in future.

The invention claimed is:

1. An electronic cigarette, to be supplied to a user in packaging containing a magnet, comprising:
   a body with a mouthpiece to supply a fluid flow to a user;
   an actuator to entrain a composition in the fluid flow;
   a control circuit to control operation of the actuator; and
   a magnetically responsive switch arrangement configured to control supply of electrical current to the control circuit to disable the supply of current whilst the electronic cigarette is in the packaging and to enable the electronic cigarette for operation in response to being removed from the packaging.

2. Apparatus comprising:
   an electronic smoking article to be powered by a battery in first and second different modes that consume different levels of electrical power, the electronic smoking article comprising at least first and second parts, wherein the first part is separable from the second part and produces a magnetic field, and wherein the electronic smoking article is configured to detect changes in the magnetic field at the electronic smoking article device and in response thereto, to change its mode.

3. The apparatus of claim 2, wherein the apparatus is configured to be shipped with the first and second parts separated, and wherein the first and second parts are configured to be joined together prior to use.

4. Apparatus comprising:
   an electronic smoking article to be powered by a battery in first and second different modes that consume different levels of electrical power, the electronic smoking article including a mouthpiece; and
   a part that is separable from the electronic smoking article in preparation for its operation,
   wherein the separable part produces a magnetic field and the electronic smoking article is configured to detect changes in the magnetic field at the electronic smoking article and in response thereto, to change its mode.

5. Apparatus according to claim 4, wherein in the first mode the current drawn from the battery is less than 5 μAmp.

6. Apparatus according to claim 4, wherein in the first mode the lifetime for one battery charge is at least 3 times greater than the lifetime for one battery charge in the second mode.

7. Apparatus according to claim 4 wherein the first mode is a storage mode in which the electronic smoking article consumes a relatively low level of battery power, and the second mode is an operational mode that consumes a higher battery power level than the first mode.

8. Apparatus according to claim 7 wherein the electronic smoking article is configured to detect a reduced strength of magnetic field from the separable part upon separation thereof from the electronic smoking article so as to switch from the storage mode to the operational mode.

9. Apparatus according to claim 7 wherein the separable part comprises packaging that includes a receptacle for the electronic smoking article, and a permanent magnet that provides a magnetic field, the apparatus being so configured that the electronic smoking article switches from the first mode to the second mode on removal from the packaging.

10. Apparatus according to claim 9 wherein the electronic smoking article is configured to switch from the second mode to the first mode on insertion into the receptacle in the packaging.

11. Apparatus according to claim 9 wherein the magnet is mounted within the packaging so as not to be normally accessible to the user.

12. Apparatus according to claim 9 wherein the packaging comprises a sheet of plastics material including a recess of a shape complementary to that of the device, with the magnet received in the plastics material adjacent the recess.

13. Apparatus according to claim 9 wherein the packaging comprises a carrying case with a flip-top lid.

14. Apparatus according to claim 9 wherein the electronic smoking article has a generally cylindrical body and the packaging includes a sleeve removably fitted to one end of the body, the sleeve including the permanent magnet.

15. Apparatus according to claim 7 wherein the electronic smoking article includes a control circuit and a magnetically responsive switch arrangement operative to control supply of electrical current to the control circuit in response to changes in the magnetic field.

16. Apparatus according to claim 15 wherein the magnetically responsive switch arrangement includes a Hall effect device to provide an electrical control signal as a function of the magnetic field, and a switch responsive to the electrical control signal to switch on or off the supply of electrical current from the battery to the control circuit.

17. Apparatus according to claim 15 wherein the electronic smoking article comprises a fluid flow generator and includes an actuator to be powered by the battery under the control of the control circuit to entrain a composition from a supply thereof in a fluid flow for delivery to a user.

18. Apparatus according to claim 17 wherein the actuator includes an electrical heater.

19. Apparatus according to claim 18 wherein the heater is configured to vaporize liquid from a supply thereof and to entrain the vaporized liquid in airflow delivered to the user.

20. Apparatus according to claim 17 wherein the electronic smoking article includes a body having a mouthpiece, and a pressure sensor to detect when a user draws on the mouthpiece, the control circuit being responsive to the pressure sensor to power the actuator so as to entrain the composition in the fluid flow delivered to the user through the mouthpiece whilst the user draws the fluid flow through the mouthpiece.

21. Apparatus according to claim 20 wherein the electronic smoking article includes a control unit that includes the battery and the control circuit, a vapor device detachably mountable on the control unit and including the actuator, the mouthpiece being detachably mountable on the vapor device.

* * * * *